(12) United States Patent
Chou et al.

(10) Patent No.: US 11,114,532 B2
(45) Date of Patent: Sep. 7, 2021

(54) SEMICONDUCTOR STRUCTURES AND METHODS OF FORMING THE SAME

(71) Applicant: Vanguard International Semiconductor Corporation, Hsinchu (TW)

(72) Inventors: Cheng-Wei Chou, Taoyuan (TW); Hsin-Chih Lin, Hsinchu (TW); Yu-Chieh Chou, New Taipei (TW); Chang-Xiang Hung, Budai Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 63 days.

(21) Appl. No.: 16/689,923

(22) Filed: Nov. 20, 2019

(65) Prior Publication Data
US 2021/0151571 A1     May 20, 2021

(51) Int. Cl.
*H01L 29/40*      (2006.01)
*H01L 29/66*      (2006.01)
*H01L 29/778*     (2006.01)

(52) U.S. Cl.
CPC .......... *H01L 29/404* (2013.01); *H01L 29/401* (2013.01); *H01L 29/66462* (2013.01); *H01L 29/7786* (2013.01)

(58) Field of Classification Search
CPC ............... H01L 29/404; H01L 29/7786; H01L 29/66462; H01L 29/66431
See application file for complete search history.

(56) References Cited

U.S. PATENT DOCUMENTS

| | | | |
|---|---|---|---|
| 9,722,063 B1 * | 8/2017 | Kudymov | H01L 29/41758 |
| 11,043,583 B2 * | 6/2021 | Chou | H01L 29/7786 |
| 2005/0253168 A1 * | 11/2005 | Wu | H01L 29/7787 257/192 |
| 2014/0159050 A1 * | 6/2014 | Yoon | H01L 21/02118 257/76 |
| 2016/0190297 A1 * | 6/2016 | Kudymov | H01L 29/404 257/76 |
| 2017/0047251 A1 * | 2/2017 | Lee | H01L 21/76805 |
| 2017/0062581 A1 * | 3/2017 | You | H01L 29/66462 |
| 2021/0083085 A1 * | 3/2021 | Chang | H01L 29/2003 |

FOREIGN PATENT DOCUMENTS

| | | |
|---|---|---|
| CN | 105720096 A | 6/2016 |
| TW | 200607092 A | 2/2006 |
| TW | 201709419 A | 3/2017 |

* cited by examiner

*Primary Examiner* — Joseph C. Nicely
(74) *Attorney, Agent, or Firm* — Birch, Stewart, Kolasch & Birch LLP

(57) ABSTRACT

A semiconductor structure is provided. The semiconductor structure includes: a substrate; a source structure and a drain structure disposed on the substrate; a gate structure disposed on the substrate and between the source structure and the drain structure; a first field plate disposed on the substrate; a first oxide layer disposed between the substrate and the first field plate; a second field plate disposed on the first field plate, wherein the second field plate is closer to the drain structure than the first field plate; a planarized second oxide layer disposed between the first oxide layer and the second field plate; and a third field plate disposed on the second field plate, wherein the third field plate is closer to the drain structure than the second field plate.

20 Claims, 8 Drawing Sheets

SEMICONDUCTOR STRUCTURES AND METHODS OF FORMING THE SAME

BACKGROUND OF THE INVENTION

Field of the Invention

The present disclosure relates to a semiconductor structure, and in particular it relates to a high electron mobility transistor.

Description of the Related Art

High electron mobility transistors (HEMT) are widely used in high-power semiconductor devices due to such advantages as high breakdown voltage and high output voltage.

The GaN material has been actively developed for application in radio frequency and power because it has wide band gaps and high-speed electrons. A good GaN HEMT device requires a good source-to-drain on-resistance ($R_{DS-ON}$). However, when the HEMT device is being operated, high voltages and high electric fields will cause damage to the HEMT device and increase $R_{DS-ON}$. The increase in $R_{DS-ON}$ is also called current collapse or $R_{DS-ON}$ dispersion.

Although existing high electron mobility transistors substantially improve the problem of $R_{DS-ON}$ dispersion, they are not satisfactory in all respects. Therefore, there is still a need for a novel high electron mobility transistor to meet various needs.

BRIEF SUMMARY OF THE INVENTION

Some embodiments of the present invention provide a semiconductor structure. The semiconductor structure includes a substrate; a source structure and a drain structure disposed on the substrate; a gate structure disposed on the substrate and between the source structure and the drain structure; the first field plate disposed on the substrate; the first oxide layer disposed between the substrate and the first field plate; a second field plate disposed on the first field plate, wherein the second field plate is closer to the drain structure than the first field plate; a planarized second oxide layer disposed between the first oxide layer and the second field plate; and a third field plate disposed on the second field plate, wherein the third field plate is closer to the drain structure than the second field plate.

Some embodiments of the present invention provide a method of forming a semiconductor structure. The method includes providing a substrate; forming a source structure and a drain structure on the substrate; forming a gate structure on the substrate and between the source structure and the drain structure; forming a first field plate on the substrate; forming a first oxide layer between the substrate and the first field plate; forming a second field plate on the first field plate, wherein the second field plate is closer to the drain structure than the first field plate; forming a planarized second oxide layer between the first oxide layer and the second field plate; and forming a third field plate on the second field plate, wherein the third field plate is closer to the drain structure than the second field plate.

BRIEF DESCRIPTION OF THE DRAWINGS

The embodiments of the present invention will be described in detail below with reference made to the accompanying drawings. It should be noted that, in accordance with standard practice in the industry, the various features are not drawn to scale and are merely illustrative. In fact, the dimensions of the elements may be arbitrarily enlarged or reduced to clearly show the features of the embodiments of the present invention.

DETAILED DESCRIPTION OF THE INVENTION

Figure 1:
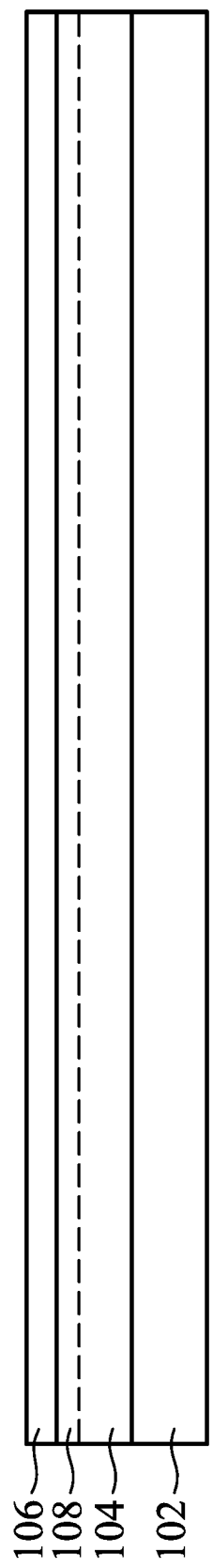
FIG. 1 is a cross-sectional view illustrating one stage of forming a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper," and the like, may be used herein to easily describe one element's or feature's relationship to another element(s) or feature(s) as illustrated in the figures. The spatially relative terms are intended to encompass different orientations of the device in use or operation, in addition to the orientation depicted in the figures. The apparatus may be otherwise oriented (e.g., rotated 90 degrees or at other orientations) and the spatially relative descriptors used herein may likewise be interpreted accordingly.

Herein, the terms "about", "around" and "substantially" typically mean +/−20% of the stated value or range, typically +/−10% of the stated value or range, typically +/−5% of the stated value or range, typically +/−3% of the stated value or range, typically +/−2% of the stated value or range, typically +/−1% of the stated value or range, and typically +/−0.5% of the stated value or range. The stated value of the present disclosure is an approximate value. Namely, the meaning of "about", "around" and "substantially" may be implied if there is no specific description of "about", "around" and "substantially".

It should be understood that although the terms "first", "second", "third" etc. may be used herein to describe various elements, components, regions, layers, and/or portions, these elements, components, regions, layers, and/or portions should not be limited by these terms. These terms are only used to distinguish one element, component, region, layer, and/or portion from another element, component, region, layer and/or portion. Thus, a first element, component, region, layer, and/or portion discussed below could be termed a second element, component, region, layer, and/or portion without departing from the teachings of the present disclosure.

Although the steps in some of the described embodiments are performed in a particular order, these steps can also be performed in other logical orders. In various embodiments, some of the described steps may be replaced or omitted, and some other operations may be performed before, during, and/or after the steps described in the embodiments of the present invention. The high electron mobility transistor in the embodiments of the invention may incorporate other features. Some features may be replaced or omitted in different embodiments.

Elements or layers with similar names may be formed using similar materials or methods unless otherwise stated.

The embodiments of the present invention provide a semiconductor structure and a method of forming the same. The electric field can be dispersed, the device characteristics can be improved and the breakdown voltage is increased by disposing a plurality of field plates which are arranged in the direction toward the drain structure between the source structure and the gate structure. Since the field plates are electrically connected to the source structure or the gate structure by the wires instead of being electrically connected to the source structure or the gate structure directly, the process window and design rules can be improved. In addition, by using a planarization process, a semiconductor structure having field plate functions, a planarized surface profile and process stability can be better obtained.

FIGS. 1 to 8 are cross-sectional views illustrating various stages of forming a semiconductor structure 100 in accordance with some embodiments. As shown in FIG. 1, a substrate 102 is provided. In some embodiments, the substrate 102 may be an $Al_2O_3$ (sapphire) substrate. Moreover, the substrate 102 may be a semiconductor substrate. The semiconductor substrate may also be elementary semiconductors including silicon (Si) or germanium (Ge); compound semiconductors including gallium nitride (GaN), silicon carbide (SiC), gallium arsenide (GaAs), gallium phosphide (GaP), indium phosphide (InP), indium arsenide (InAs) and/or indium antimonide (InSb); alloy semiconductors including SiGe, GaAsP, AlInAs, AlGaAs, GaInAs, GaInP and/or (GaInAsP) or a combination thereof. In some embodiments, the substrate 102 may be a single crystal substrate, a multi-layer substrate, a gradient substrate, other suitable substrates, or a combination thereof. Moreover, the substrate 102 may also be a semiconductor on insulator (SOI) substrate. The SOI substrate may include a base plate, a buried oxide (BOX) layer disposed on the base plate, or a semiconductor layer disposed on the buried oxide (BOX) layer.

Next, a buffer layer 104 is formed on the substrate 102. In some embodiments, the buffer layer 104 includes a III-V semiconductor such as GaN. The buffer layer 104 may also include AlGaN, AlN, GaAs, GaInP, AlGaAs, InP, InAlAs, InGaAs, other suitable III-V semiconductor materials, or a combination thereof. In some embodiments, the buffer layer 104 may be formed on the substrate 102 by molecular-beam epitaxy (MBE), hydride vapor phase epitaxy (HYPE), metalorganic chemical vapor deposition (MOCVD), chemical vapor deposition (CVD), atomic layer deposition (ALD), physical vapor deposition (PVD), molecular beam deposition (MBD), plasma enhanced chemical vapor deposition (PECVD), other suitable methods, or a combination thereof.

Next, a barrier layer 106 is formed on the buffer layer 104. In some embodiments, the barrier layer 106 includes a different material than that of the buffer layer 104. The barrier layer 106 may include III-V semiconductors such as $Al_xGa_{1-x}N$, where 0<x<1. The barrier layer 106 may also include GaN, AlN, GaAs, GaInP, AlGaAs, InP, InAlAs, InGaAs, other suitable III-V materials, or a combination thereof. In some embodiments, the barrier layer 106 may be formed on the buffer layer 104 by molecular-beam epitaxy (MBE), hydride vapor phase epitaxy (HVPE), metalorganic chemical vapor deposition (MOCVD), chemical vapor deposition (CVD), atomic layer deposition (ALD), physical vapor deposition (PVD), molecular beam deposition (MBD), plasma enhanced chemical vapor deposition (PECVD), other suitable methods, or a combination thereof.

Since the materials of the buffer layer 104 and the barrier layer 106 are different, the band gaps are different, and a heterojunction is formed at the interface between the buffer layer 104 and the barrier layer 106. The band bends at the heterojunction, and a quantum well is formed at the deep of the conduction band. The electrons produced by piezoelectricity are confined in the quantum well. Therefore, a two-dimensional electron gas (2DEG) is formed at the interface between the buffer layer 104 and the barrier layer 106, and a conducting current is formed. As shown in FIG. 1, a channel region 108 is formed at the interface between the buffer layer 104 and the barrier layer 106. The channel region 108 is where the conducting current is formed by the two-dimensional electron gas (2DEG).

Figure 2:
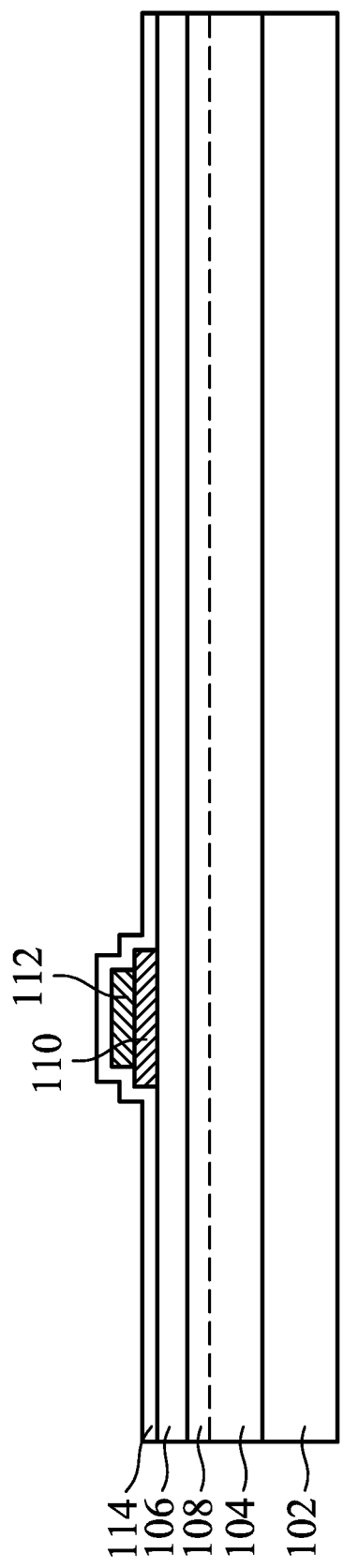
FIG. 2 is a cross-sectional view illustrating one stage of forming a semiconductor structure in accordance with some embodiments.

Next, referring to FIG. 2, a gate electrode 110, a gate protection layer 112 and a dielectric layer 114 are formed on the barrier layer 106. To be specific, a conductive layer and a protection layer are sequentially formed on the barrier layer 106 by chemical vapor deposition, atomic layer deposition, physical vapor deposition, molecular beam deposition, plasma enhanced chemical vapor deposition, other suitable methods, or a combination thereof. Then, a photoresist material is formed on the top surface of the barrier layer 106 by a suitable process such as spin coating or chemical vapor deposition, atomic layer deposition, physical vapor deposition, molecular beam deposition, plasma enhanced chemical vapor deposition, other suitable methods or other suitable deposition methods or a combination of thereof, and then optical exposure, post-exposure bake and development are performed to remove a portion of the photoresist material to form a patterned photoresist layer that will serve as an etch mask for etching. A bi- or tri-layered photoresist may be performed. Then, the gate electrode 110 and the gate protection layer 112 are formed by using any suitable etching process, such as reactive ion etch (RIE), neutral beam etch (NBE), the like or a combination thereof to remove the conductive layer and the protection layer that are not covered by the patterned photoresist layer. In some embodiments, the gate electrode 110 may include GaN, AN, GaAs, GaInP, AlGaAs, InP, InAlAs, InGaAs, MgGaN, other suitably doped III-V materials, or a combination thereof. In a particular embodiment, the gate electrode 110 includes GaN. In some embodiments, the gate protection layer 112 may include polysilicon, a metal (e.g., tungsten, titanium, aluminum, copper, molybdenum, nickel, platinum, the like, or a combination thereof), a metal alloy, a metal nitride (e.g., tungsten nitride, molybdenum nitride, titanium nitride, tantalum nitride, the like, or a combination thereof), a metal silicide (e.g., tungsten silicide, titanium silicide, cobalt silicide, nickel silicide, platinum silicide, antimony silicide, the like, or a combination thereof), a metal oxide (yttrium oxide, indium tin oxide, the like, or a combination thereof), other suitable conductive materials, or a combination thereof. In a particular embodiment, the gate protection layer 112 may include a metal nitride, such as titanium nitride (TiN).

Subsequently, the photoresist layer may be removed by etching or any other suitable method. In some embodiments, an etching process may be further performed on the gate protection layer 112 so that the sidewalls of the gate protection layer 112 are between the sidewalls of the gate electrode 110. In other embodiments, the sidewalls of the gate protection layer 112 align with the sidewalls of the gate electrode 110. By disposing the gate protection layer 112 on the gate electrode 110, it can be ensured that the gate electrode 110 is not affected by the process flow.

Then, a dielectric layer 114 is formed on the barrier layer 106, the gate electrode 110 and the gate protection layer 112 by chemical vapor deposition, atomic layer deposition, physical vapor deposition, molecular beam deposition, plasma enhanced chemical vapor deposition, other suitable methods, or a combination thereof. For example, the dielectric layer 114 is conformally formed on the barrier layer 106, the gate electrode 110, and the gate protection layer 112. To be specific, the dielectric layer 114 is formed on the top surface of the barrier layer 106, the sidewalls and the top surface of the gate electrode 110, and the sidewalls and top surface of the gate protection layer 112. In some embodiments, the dielectric layer 114 includes $SiO_2$, $SiN_3$, $SiON$, $Al_2O_3$, $MgO$, $Sc_2O_3$, $HfO_2$, $HfSiO$, $HfSiON$, $HfTaO$, $HfSiO$, $HfZrO$, $LaO$, $ZrO$, $TiO_2$, $ZnO_2$, $ZrO_2$, $AlSiN_3$, $SiC$, or $Ta_2O_5$, other suitable dielectric materials, or a combination thereof. In a particular embodiment, the dielectric layer 114 includes $Al_2O_3$.

Figure 3:
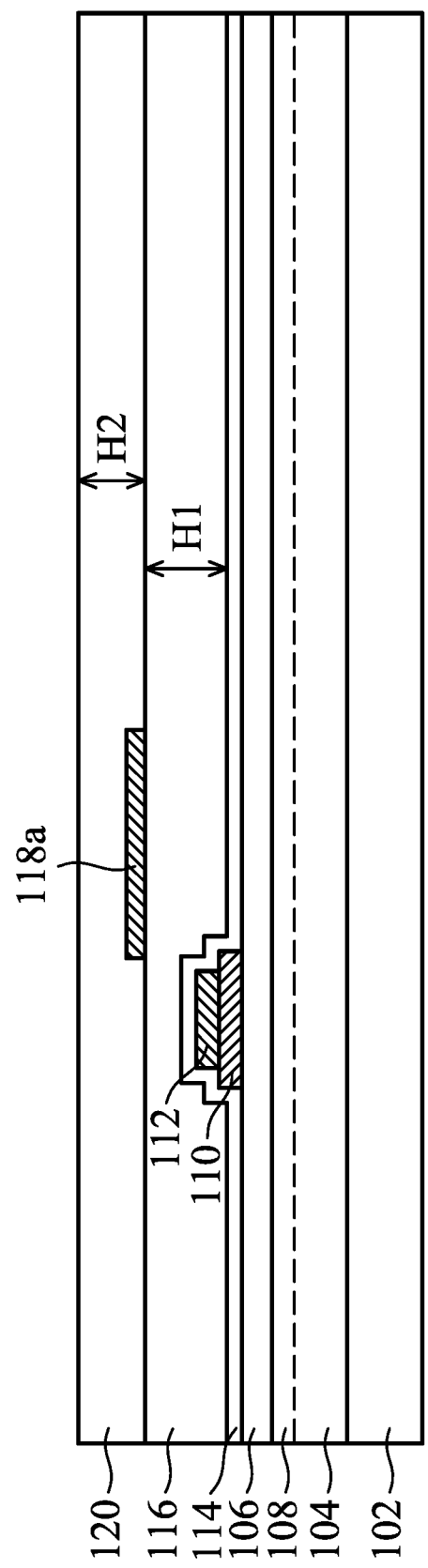
FIG. 3 is a cross-sectional view illustrating one stage of forming a semiconductor structure in accordance with some embodiments.

Next, referring to FIG. 3, a first oxide layer 116 is formed on the substrate 102. To be specific, the first oxide layer 116 is formed on the dielectric layer 114 by chemical vapor deposition, atomic layer deposition, physical vapor deposition, molecular beam deposition, plasma enhanced chemical vapor deposition, other suitable methods, or a combination thereof. The first oxide layer 116 may include $SiO_2$, $SiN_3$, $SiON$, $Al_2O_3$, $MgO$, $Sc_2O_3$, $HfO_2$, $HfSiO$, $HfSiON$, $HfTaO$, $HfTiO$, $HfZrO$, $LaO$, $ZrO$, $TiO_2$, $ZnO_2$, $ZrO_2$, $Ta_2O_5$, other suitable oxides or a combination thereof. In a particular embodiment, the first oxide layer 116 includes $SiO_2$. Then, a planarization process is performed on the first oxide layer 116, such as a chemical mechanical polishing process. The vertical distance between the top surface of the first oxide layer 116 and the bottommost surface of the first oxide layer 116 is the first thickness H1 of the first oxide layer 116. The first thickness H1 of the first oxide layer 116 can be 100 nm~400 nm. In some embodiments, the first thickness H1 of the first oxide layer 116 can be 100 nm~200 nm, 200 nm~300 nm or 300 nm~400 nm.

Next, a first field plate 118a is formed on the substrate 102. To be specific, the conductive layer is formed on the first oxide layer 116 by chemical vapor deposition, atomic layer deposition, physical vapor deposition, molecular beam deposition, plasma enhanced chemical vapor deposition, other suitable methods, or a combination thereof. In some embodiments, the conductive layer may include polysilicon, a metal (e.g., tungsten, titanium, aluminum, copper, molybdenum, nickel, platinum, the like, or a combination thereof), a metal alloy, a metal nitride (e.g., tungsten nitride, molybdenum nitride, titanium nitride, tantalum nitride, the like, or a combination thereof), a metal silicide (e.g., tungsten silicide, titanium silicide, cobalt silicide, nickel silicide, platinum silicide, antimony silicide, the like, or a combination thereof), a metal oxide (yttrium oxide, indium tin oxide, the like, or a combination thereof), other suitable conductive materials, or a combination thereof. Then, a patterning process is performed on the conductive layer to form the first field plate 118a, wherein the first field plate 118a partially overlaps the gate electrode 110. To be specific, the left sidewall of the first field plate 118a is between the left sidewall and the right sidewall of the gate electrode 110.

Next, a second oxide layer 120 is formed on the substrate 102. To be specific, the second oxide layer 120 is formed on the first oxide layer 116 and the first field plate 118a by chemical vapor deposition, atomic layer deposition, physical vapor deposition, molecular beam deposition, plasma enhanced chemical vapor deposition, other suitable methods, or a combination thereof. In some embodiments, the material of the second oxide layer 120 may be the same as that of the first oxide layer 116. Then, a planarization process is performed on the second oxide layer 120, such as a chemical mechanical polishing process. The vertical distance between the top surface of the second oxide layer 120 and the bottommost surface of the second oxide layer 120 is the second thickness H2 of the second oxide layer 120. The second thickness H2 of the second oxide layer 120 can be 100 nm ~400 nm. In some embodiments, the second thickness H2 of the second oxide layer 120 can be 100 nm~200 nm, 200 nm~300 nm or 300 nm~400 nm.

Figure 4:
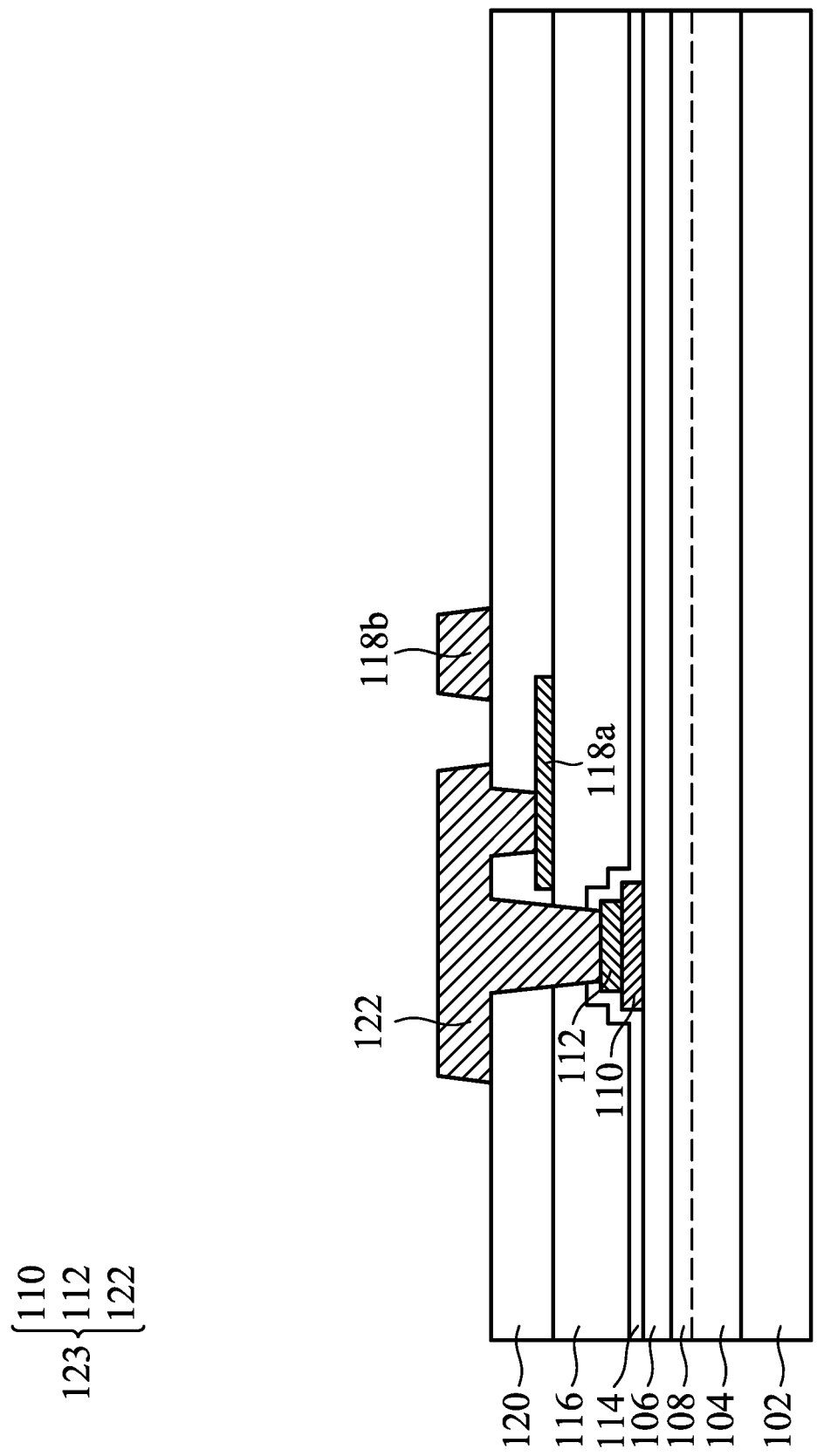
FIG. 4 is a cross-sectional view illustrating one stage of forming a semiconductor structure in accordance with some embodiments.

Next, referring to FIG. 4, a photoresist material is formed on the top surface of the second oxide layer 120 by a suitable process such as spin coating or chemical vapor deposition, atomic layer deposition, physical vapor deposition, molecular beam deposition, plasma enhanced chemical vapor deposition, other suitable methods or other suitable deposition methods or a combination of thereof, and then optical exposure, post-exposure bake and development are performed to remove a portion of the photoresist material to form a patterned photoresist layer that will serve as an etch mask for etching. A bi- or tri-layered photoresist may be performed. Then, any suitable etching process, such as reactive ion etch, neutral beam etch, the like or a combination thereof are used to etch through the second oxide layer 120, the first oxide layer 116 and the dielectric layer 114 to form an opening corresponding to the gate electrode 110 and exposing a portion of the top surface of the gate protection layer 112; and to etch through the second oxide layer 120 to form another opening corresponding to the first field plate 118a and exposing a portion of the top surface of the first field plate 118a.

Next, a metal layer is formed on the second oxide layer 120 and in the openings by chemical vapor deposition, atomic layer deposition, physical vapor deposition, molecular beam deposition, plasma enhanced chemical vapor deposition, other suitable methods, or a combination thereof. Then, the metal layer is patterned to form a gate metal layer 122 and a second field plate 118b, wherein the gate metal layer 122 electrically connects the gate electrode 110 to the first field plate 118a; and there is an opening between the second field plate 118b and the gate metal layer 122. The gate structure 123 includes the gate metal layer 122, the gate protection layer 112, and the gate electrode 110. The second field plate 118b partially overlaps the first field plate 118a. To be specific, the left sidewall of the second field plate 118b is between the left sidewall and the right sidewall of the first field plate 118a.

Figure 5:
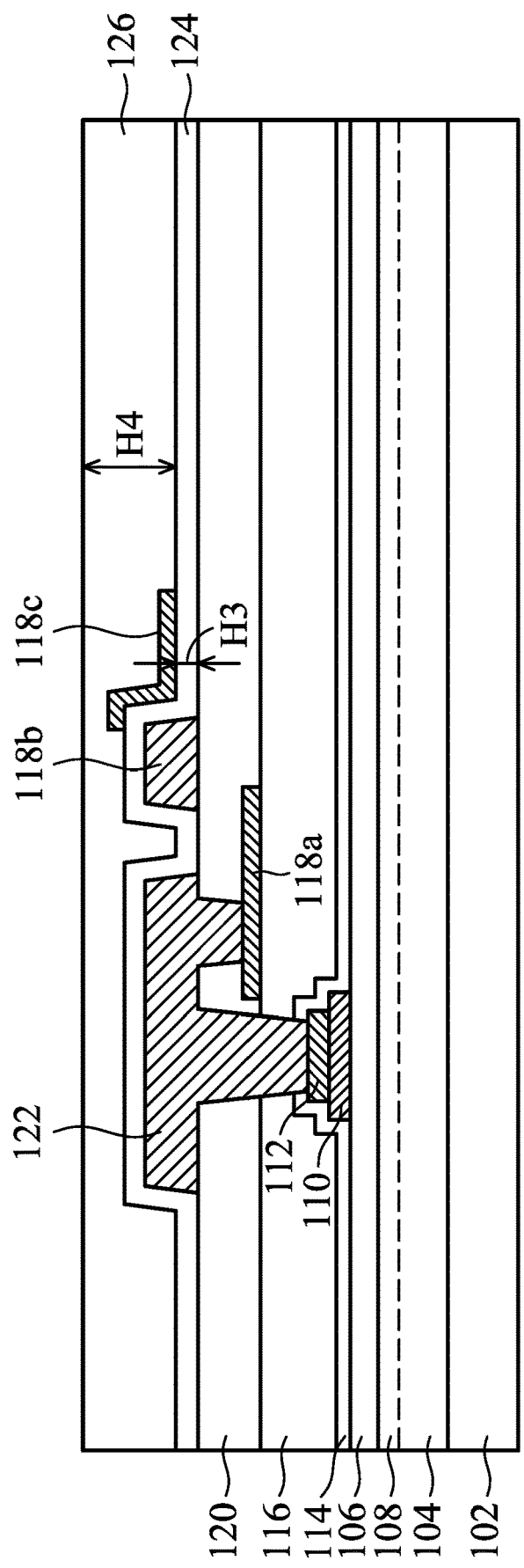
FIG. 5 is a cross-sectional view illustrating one stage of forming a semiconductor structure in accordance with some embodiments.

Next, referring to FIG. 5, the third oxide layer 124 is conformally formed on the second oxide layer 120, the gate metal layer 122 and the second field plate 118b by chemical vapor deposition, atomic layer deposition, physical vapor deposition, molecular beam deposition, plasma enhanced chemical vapor deposition, other suitable methods, or a combination thereof. To be specific, the third oxide layer 124 is formed on the top surface of the second oxide layer 120, on the sidewalls and the top surface of the gate metal layer 122 and on the sidewalls and top surface of the second field plate 118b. In some embodiments, the material of the third oxide layer 124 may be the same as that of the first oxide layer 116. The deposition thickness of the third oxide layer 124 is the third thickness H3. The third thickness H3 of the third oxide layer 124 can be 100 nm-400 nm. In some embodiments, the third thickness H3 of the third oxide layer 124 can be 100 nm~200 nm, 200 nm~300 nm or 300 nm~400 nm. In some embodiments, a planarization process can be performed on the third oxide layer 124, such as a chemical mechanical polishing process.

Next, a conductive layer is formed on the third oxide layer 124 by chemical vapor deposition, atomic layer deposition, physical vapor deposition, molecular beam deposition, plasma enhanced chemical vapor deposition, other suitable methods, or a combination thereof. In some embodiments, the material of the conductive layer may be the same as the material described above. Then, the conductive layer is patterned to form a third field plate 118c. The third field plate 118c partially overlaps the second field plate 118b. To be specific, the left sidewall of the third field plate 118c is between the left sidewall and the right sidewall of the second field plate 118b. In some embodiments, the third field plate 118c can align with the second field plate 118b. To be specific, the left sidewall of the third field plate 118c aligns with the right sidewall of the second field plate 118b.

Next, a fourth oxide layer 126 is formed on the third oxide layer 124 and the third field plate 118c by chemical vapor deposition, atomic layer deposition, physical vapor deposition, molecular beam deposition, plasma enhanced chemical vapor deposition, other suitable methods, or a combination thereof. In some embodiments, the material of the fourth oxide layer 126 can be the same as that of the first oxide layer 116. Then, a planarization process is performed on the fourth oxide layer 126, such as a chemical mechanical polishing process. The vertical distance between the top surface of the fourth oxide layer 126 and the bottommost surface of the fourth oxide layer 126 is the fourth thickness H4 of the fourth oxide layer 126. The fourth thickness H4 of the fourth oxide layer 126 can be 100 nm~400 nm. In some embodiments, the fourth thickness H4 of the fourth oxide layer 126 can be 100 nm~200 nm, 200 nm~300 nm or 300 nm~400 nm.

Figure 6:
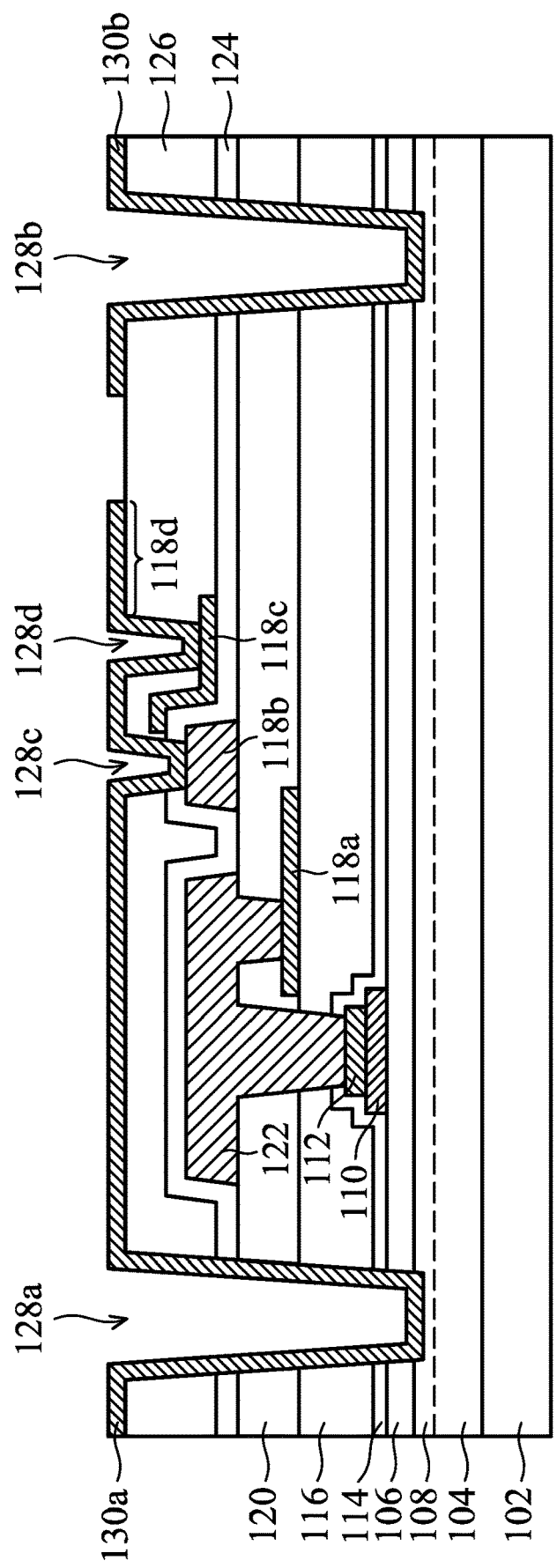
FIG. 6 is a cross-sectional view illustrating one stage of forming a semiconductor structure in accordance with some embodiments.

Next, referring to FIG. 6, a patterning process is performed to form an opening 128a, an opening 128b, an opening 128c and an opening 128d. The opening 128a and the opening 128b go through the fourth oxide layer 126, the third oxide layer 124, the second oxide layer 120, the first oxide layer 116, the dielectric layer 114, the barrier layer 106 and a portion of the channel region 108. The opening 128c goes through the fourth oxide layer 126 and the third oxide layer 124. The opening 128d goes through the fourth oxide layer 126. The opening 128a and the opening 128b are on two opposite sides of the gate structure 123, respectively, wherein the opening 128a is used to form a subsequent source structure 135A; and the opening 128b is used to form a subsequent drain structure 135B. The opening 128c corresponds to the second field plate 118b and exposes the top surface of the second field plate 118b; and the opening 128d corresponds to the third field plate 118c and exposes the top surface of the third field plate 118c.

Next, a conductive layer is formed on the top surface of the fourth oxide layer 126 and the sidewalls and the bottoms of the openings 128a, 128b, 128c and 128d and the third field plate 118c by chemical vapor deposition, atomic layer deposition, physical vapor deposition, molecular beam deposition, plasma enhanced chemical vapor deposition, other suitable methods, or a combination thereof. Then, the conductive layer is patterned by a patterning process and an etching process to form a conductive layer 130a in the opening 128a as a source electrode and a conductive layer 130b in the opening 128b as a drain electrode. A portion of the conductive layer 130a outside the opening 128d and located on the fourth oxide layer 126 serves as a fourth field plate 118d. Since the fourth field plate 118d is a portion of the conductive layer 130a, the number of processes can be decreased to reduce cost and save time. In some embodiments, the fourth field plate 118d can be formed in a different process without having a portion of the conductive layer 130a directly as the fourth field plate 118d.

It can be understood that although the embodiments of the present invention illustrate four field plates, one of ordinary skill in art can determine the number of field plates according to actual needs, for example, two field plates, three fields, five field plates, six field plates or more. In addition, although the second field plate 118b, the third field plate 118c and the fourth field plate 118d of the embodiments of the present invention are electrically connected to the source structure 135A through the same wire (for example, the conductive layer 130a), one of ordinary skill in the art can electrically connect some field plates to the gate structure through another wire according to actual needs. For example, the second field plate 118b and the third field plate 118c are electrically connected to the gate structure 123 by one wire; and the fourth field plate 118d is electrically connected to the source structure 135A by another wire.

Figure 7:
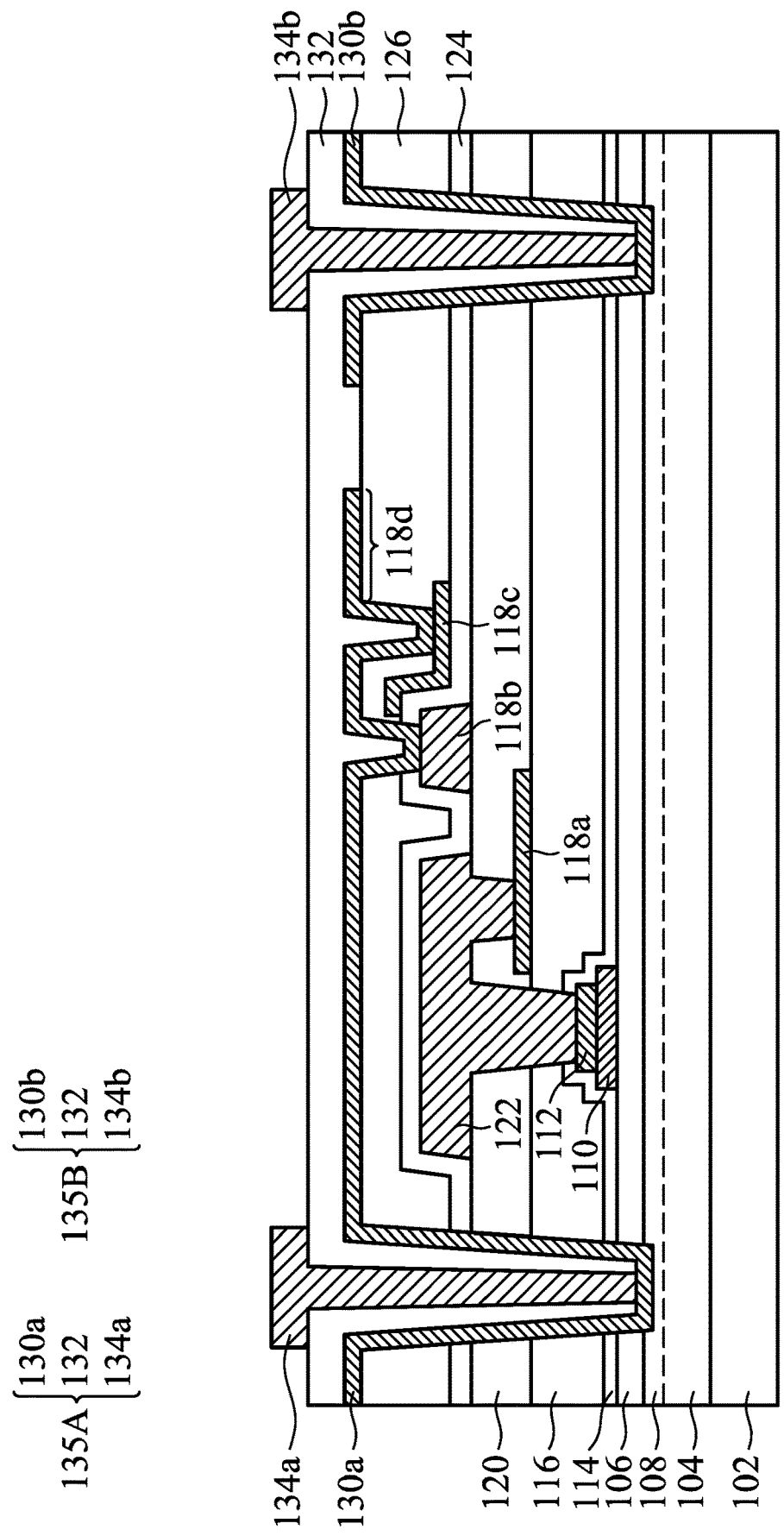
FIG. 7 is a cross-sectional view illustrating one stage of forming a semiconductor structure in accordance with some embodiments.

Next, referring to FIG. 7, the fifth oxide layer 132 is formed on the conductive layer 130a, the conductive layer 130b and the fourth oxide layer 126 by chemical vapor deposition, atomic layer deposition, physical vapor deposition, molecular beam deposition, plasma enhanced chemical vapor deposition, other suitable methods, or a combination thereof. In some embodiments, the material of the fifth oxide layer 132 can be the same as that of the first oxide layer 116. Next, a via hole corresponding to the opening 128a and exposing a portion of the conductive layer 130a, and another via hole corresponding to the opening 128b and exposing a portion of the conductive layer 130b are formed in the fifth oxide layer 132 by a patterning process and an etching process.

Then, a metal layer is formed on the fifth oxide layer 132 and in the via holes by chemical vapor deposition, atomic layer deposition, physical vapor deposition, molecular beam deposition, plasma enhanced chemical vapor deposition, other suitable methods, or a combination thereof. In some embodiments, the metal layer may include copper, aluminum, molybdenum, tungsten, gold, chromium, nickel, platinum, titanium, iridium, rhodium, an alloy thereof, a combination thereof, or other highly conductive metal materials.

Then, the metal layer is patterned to form a source metal 134a and a drain metal 134b, respectively. The source structure 135A includes the source metal 134a, the fifth oxide layer 132 located in the opening, and a portion of the conductive layer 130a serving as the source electrode. The drain structure 135B includes a drain metal 134b, the fifth oxide layer 132 located in the opening, and a portion of the conductive layer 130b serving as the drain electrode.

As shown in FIG. 7, a plurality of field plates arranged in a direction towards the drain structure 135B are disposed between the source structure 135A and the drain structure 135B. To be specific, the second field plate 118b is closer to the drain structure 135B than the first field plate 118a, the third field plate 118c is closer to the drain structure 135B than the second field plate 118b, and the fourth field plate 118d is closer to the drain structure 135B than the third field plate 118c.

Figure 8:
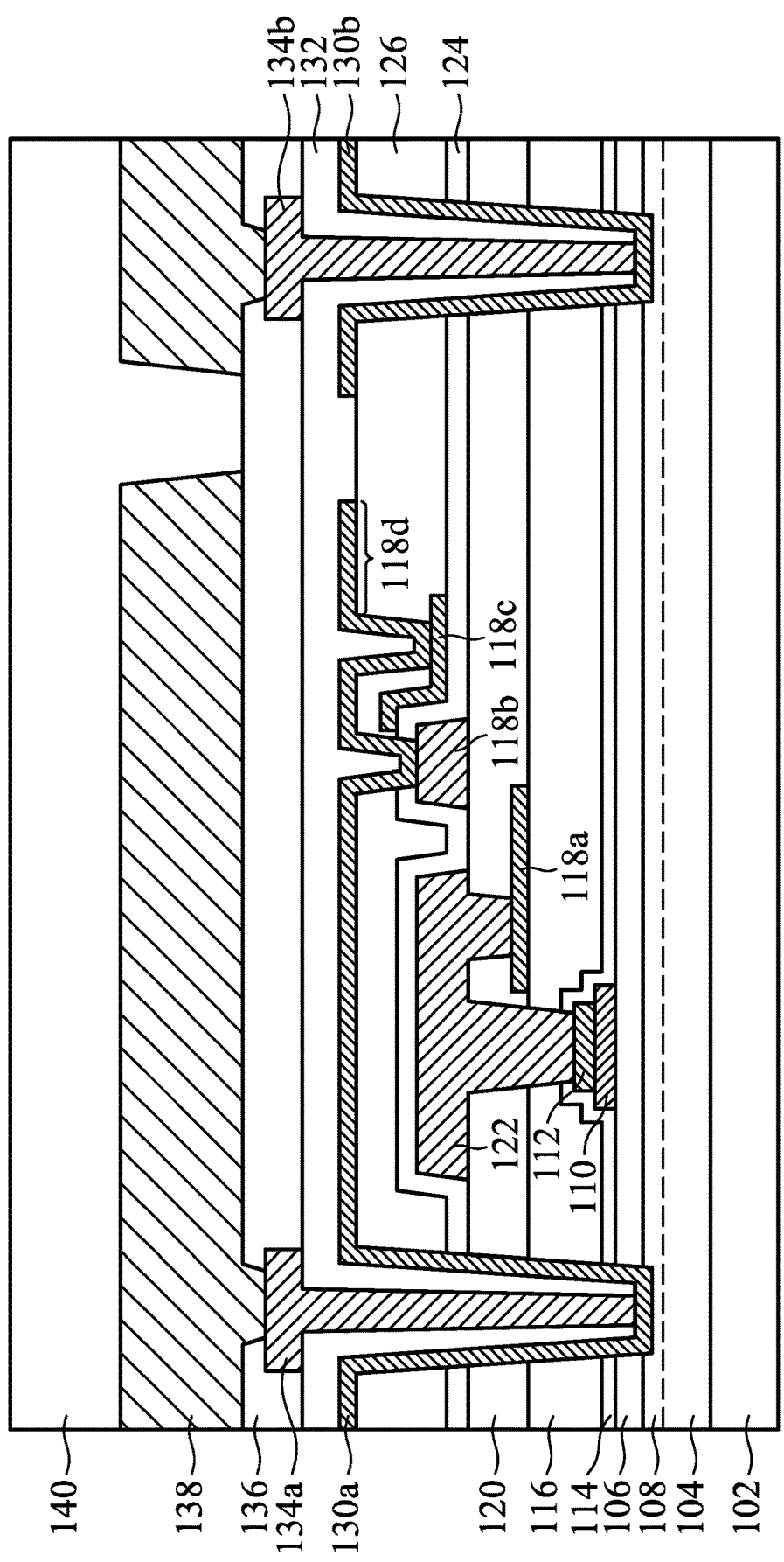
FIG. 8 is a cross-sectional view illustrating one stage of forming a semiconductor structure in accordance with some embodiments.

Next, referring to FIG. 8, the sixth oxide layer 136 is formed on the fifth oxide layer 132, the source metal 134a and the drain metal 134b by chemical vapor deposition, atomic layer deposition, physical vapor deposition, molecular beam deposition, plasma enhanced chemical vapor deposition, other suitable methods, or a combination thereof. In some embodiments, the material of the sixth oxide layer 136 is the same as that of the first oxide layer 116. Then, a patterning process is performed on the sixth oxide layer 136 to form an opening exposing the top surface of the source metal 134a and another opening exposing the top surface of the drain metal 134b.

Next, a metal layer 138 is formed on the sixth oxide layer 136 and in the opening by chemical vapor deposition, atomic layer deposition, physical vapor deposition, molecular beam deposition, plasma enhanced chemical vapor deposition, other suitable methods, or a combination thereof. Then, a patterning process is performed on the metal layer 138, so that the metal layer 138 has an opening and a portion of the metal layer 138 is electrically connected to the drain structure and another portion is electrically connected to the source structure.

Next, a nitride layer 140 is formed on the metal layer 138 and in the opening of the metal layer 138 by chemical vapor deposition, atomic layer deposition, physical vapor deposition, molecular beam deposition, plasma enhanced chemical vapor deposition, other suitable methods, or a combination thereof. In some embodiments, the nitride layer 140 may include titanium nitride, silicon nitride ($Si_3N_4$), silicon oxynitride, silicon carbonitride, the like or a combination thereof. In a particular embodiment, the nitride layer 140 may include $Si_3N_4$.

Compared with the convention technique, the embodiments of the present invention have one or more of the following advantages:

(1) The electric field can be dispersed to reduce the problem of $R_{DS-ON}$ dispersion and raise the breakdown voltage by disposing a plurality of field plates arranged in a direction towards the drain structure; and since each field plate is not independently electrically connected to the source structure or the gate structure, but is electrically connected to the source structure or the gate structure by the same wire, process window and design rule can be increased.

(2) Furthermore, since each field plate is disposed on the different oxide layers, the distance between each field plate and the barrier layer can be adjusted to further raise the breakdown voltage.

(3) Since each oxide layer is subject to a planarization process, the underlying metal layer or conductive layer can be protected from being damaged by uneven thicknesses or bad coverage of the oxide layers in some etching processes.

(4) In addition, when a single field plate is disposed, a large electric field peak appears at the edge of the field plate. Therefore, compared with a single field plate having a total length equal to a plurality of total lengths of the field plates arranged in a direction towards the drain structure, a plurality of field plates arranged in a direction towards the drain structure can effectively disperse the intensity of the electric field, thereby avoiding the occurrence of a large electric field peak.

Although the embodiments of the present disclosure and the advantages have been disclosed above, it should be understood that one of ordinary skill in the art can make changes, substitutions, and modification without departing from the spirit and scope of the present disclosure. In addition, the scope of the present disclosure is not limited to the process, machine, manufacture, compositions of matter, devices, methods and steps of particular embodiments described in the specification. Any one of ordinary skill in the art will readily appreciate from the disclosure of the present disclosure, processes, machines, manufacture, compositions of matter, devices, methods, or operations presently existing or later to be developed. As long as they can perform substantially the same functions or achieve substantially the same results in the embodiments described herein, they may be used according to the present disclosure. Accordingly, the scope of the present disclosure includes such processes, machines, manufacture, compositions of matter, devices, methods, or steps. In addition, each claim constitutes an individual embodiment, and the scope of the present disclosure also includes a combination of the claims and the embodiments. The features of the various embodiments can be arbitrarily mixed and used as long as they do not contradict or conflict the spirit of the invention.

What is claimed is:

1. A semiconductor structure, comprising:
   a substrate;
   a source structure and a drain structure disposed on the substrate;
   a gate structure disposed on the substrate and between the source structure and the drain structure;
   a first field plate disposed on the substrate;
   a first oxide layer disposed between the substrate and the first field plate;
   a second field plate disposed on the first field plate, wherein the second field plate is closer to the drain structure than the first field plate;
   a planarized second oxide layer disposed between the first oxide layer and the second field plate; and
   a third field plate disposed on the second field plate, wherein the third field plate is closer to the drain structure than the second field plate, wherein an end of the third field plate close to the source structure is closer to the drain structure than an end of the second field plate close to the source structure, and the end of the second field plate close to the source structure is closer to the drain structure than an end of the first field plate close to the source structure.

2. The semiconductor structure as claimed in claim 1, wherein the second field plate partially overlaps the first field plate.

3. The semiconductor structure as claimed in claim 2, wherein the third field plate partially overlaps the second field plate.

4. The semiconductor structure as claimed in claim 1, wherein the second field plate or the third field plate is electrically connected to the source structure.

5. The semiconductor structure as claimed in claim 1, wherein the second field plate and the third field plate are both electrically connected to the source structure.

6. The semiconductor structure as claimed in claim 1, wherein the first field plate comprises polysilicon, a metal, a metal alloy, a metal nitride, a metal silicide, a metal oxide, or a combination thereof.

7. The semiconductor structure as claimed in claim 1, wherein the gate structure comprises:
 a gate electrode disposed on the substrate;
 a gate protection layer disposed on the gate electrode; and
 a gate metal layer disposed on the gate protection layer.

8. The semiconductor structure as claimed in claim 7, wherein the gate electrode comprises GaN, AlN, GaAs, GaInP, AlGaAs, InP, InAlAs, InGaAs, MgGaN or a combination thereof.

9. The semiconductor structure as claimed in claim 7, wherein the gate protection layer comprises a metal nitride.

10. The semiconductor structure as claimed in claim 9, wherein the gate protection layer comprises titanium nitride.

11. A method of forming a semiconductor structure, comprising:
 providing a substrate;
 forming a source structure and a drain structure on the substrate;
 forming a gate structure on the substrate and between the source structure and the drain structure;
 forming a first field plate on the substrate;
 forming a first oxide layer between the substrate and the first field plate;
 forming a second field plate on the first field plate, wherein the second field plate is closer to the drain structure than the first field plate;
 forming a planarized second oxide layer between the first oxide layer and the second field plate; and
 forming a third field plate on the second field plate, wherein the third field plate is closer to the drain structure than the second field plate, wherein an end of the third field plate close to the source structure is closer to the drain structure than an end of the second field plate close to the source structure, and the end of the second field plate close to the source structure is closer to the drain structure than an end of the first field plate close to the source structure.

12. The method of forming a semiconductor structure as claimed in claim 11, wherein the second field plate partially overlaps the first field plate.

13. The method of forming a semiconductor structure as claimed in claim 11, wherein the third field plate partially overlaps the second field plate.

14. The method of forming a semiconductor structure as claimed in claim 11, wherein the second field plate or the third field plate is electrically connected to the source structure.

15. The method of forming a semiconductor structure as claimed in claim 11, wherein the second field plate and the third field plate are both electrically connected to the source structure.

16. The method of forming a semiconductor structure as claimed in claim 11, wherein the first field plate comprises polysilicon, a metal, a metal alloy, a metal nitride, a metal silicide, a metal oxide, or a combination thereof.

17. The method of forming a semiconductor structure as claimed in claim 11, wherein the gate structure comprises:
 forming a gate electrode on the substrate;
 forming a gate protection layer on the gate electrode; and
 forming a gate metal layer on the gate protection layer.

18. The method of forming a semiconductor structure as claimed in claim 17, wherein the gate electrode comprises GaN, AlN, GaAs, GaInP, AlGaAs, InP, InAlAs, InGaAs, MgGaN or a combination thereof.

19. The method of forming a semiconductor structure as claimed in claim 17, wherein the gate protection layer comprises a metal nitride.

20. The method of forming a semiconductor structure as claimed in claim 19, wherein the gate protection layer comprises titanium nitride.

* * * * *